(12) United States Patent
Vahid Far et al.

(10) Patent No.: US 9,455,723 B2
(45) Date of Patent: Sep. 27, 2016

(54) LEAKAGE COMPENSATION CIRCUIT FOR PHASE-LOCKED LOOP (PLL) LARGE THIN OXIDE CAPACITORS

(71) Applicant: QUALCOMM Incorporated, San Diego, CA (US)

(72) Inventors: Mohammad Bagher Vahid Far, San Jose, CA (US); Ara Bicakci, Belmont, CA (US); Alireza Khalili, Sunnyvale, CA (US); Ashkan Borna, Menlo Park, CA (US); Thinh Cat Nguyen, San Jose, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/743,360

(22) Filed: Jun. 18, 2015

(65) Prior Publication Data

US 2016/0254817 A1    Sep. 1, 2016

Related U.S. Application Data

(60) Provisional application No. 62/121,588, filed on Feb. 27, 2015.

(51) Int. Cl.
| | | |
|---|---|---|
| *H03L 7/06* | (2006.01) | |
| *H03L 7/08* | (2006.01) | |
| *H03L 7/093* | (2006.01) | |
| *H02M 3/07* | (2006.01) | |

(52) U.S. Cl.
CPC ............. *H03L 7/0802* (2013.01); *H02M 3/07* (2013.01); *H03L 7/093* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 5,818,268 A | 10/1998 | Kim et al. | |
| 6,963,232 B2 | 11/2005 | Frans et al. | |
| 6,972,604 B2 | 12/2005 | Boerstler et al. | |
| 7,132,865 B1 | 11/2006 | Terrovitis et al. | |
| 7,176,731 B2 | 2/2007 | Baez et al. | |
| 7,932,757 B2* | 4/2011 | Raghunathan | H03L 7/0891 327/149 |
| 8,018,269 B2 | 9/2011 | Wang et al. | |
| 2005/0110535 A1* | 5/2005 | Bernstein | H03L 7/093 327/156 |
| 2009/0001993 A1* | 1/2009 | Lindsey | B60L 3/0023 324/509 |
| 2010/0001771 A1 | 1/2010 | Liu et al. | |
| 2011/0234273 A1* | 9/2011 | Lin | H03L 7/0895 327/157 |
| 2013/0229213 A1 | 9/2013 | Park et al. | |
| 2014/0239978 A1* | 8/2014 | Delzer | G01R 27/28 324/619 |
| 2015/0285850 A1* | 10/2015 | Liu | G01R 27/025 324/551 |
| 2016/0112053 A1* | 4/2016 | Perrott | H03L 7/0802 327/156 |
| 2016/0125811 A1* | 5/2016 | Park | G09G 3/3258 345/694 |
| 2016/0133190 A1* | 5/2016 | Kim | G09G 3/3258 345/80 |

FOREIGN PATENT DOCUMENTS

JP          2007184778 A      7/2007

OTHER PUBLICATIONS

International Search Report and Written Opinion—PCT/US2016/014687—ISA/EPO—Apr. 15, 2016.
Holzer R., "16.5 A 1V CMOS PLL Designed in High-Leakage CMOS Process Operating at 10-700MHz," ISSCC 2002 / Session 16 / High Speed I/O / 16.5, 2002, pp. 220, 221 & 482.

* cited by examiner

*Primary Examiner* — Adam Houston
(74) *Attorney, Agent, or Firm* — Patterson & Sheridan, L.L.P.

(57) ABSTRACT

Certain aspects of the present disclosure provide methods and apparatus for compensating, or at least adjusting, for capacitor leakage. One example method generally includes determining a leakage voltage corresponding to a leakage current of a capacitor in a filter for a phase-locked loop (PLL), wherein the determining comprises closing a set of switches for discontinuous sampling of the leakage voltage; based on the sampled leakage voltage, generating a sourced current approximately equal to the leakage current; and injecting the sourced current into the capacitor.

30 Claims, 8 Drawing Sheets

LEAKAGE COMPENSATION CIRCUIT FOR PHASE-LOCKED LOOP (PLL) LARGE THIN OXIDE CAPACITORS

CLAIM OF PRIORITY UNDER 35 U.S.C. §119

The present application claims benefit of U.S. Provisional Patent Application Ser. No. 62/121,588, entitled "LEAKAGE COMPENSATION CIRCUIT FOR PHASE-LOCKED LOOP (PLL) LARGE THIN OXIDE CAPACITORS" and filed Feb. 27, 2015, which is assigned to the assignee of the present application and hereby expressly incorporated by reference herein in its entirety.

TECHNICAL FIELD

Certain aspects of the present disclosure generally relate to radio frequency (RF) circuits and, more particularly, to leakage current compensation, or at least adjustment, for capacitors in phase-locked loop (PLL) circuits.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System-Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, $3^{rd}$ Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

SUMMARY

Certain aspects of the present disclosure generally relate to leakage current compensation, or at least adjustment, for a filter capacitor in a phase-locked loop (PLL), for example.

Certain aspects of the present disclosure provide a method for capacitor leakage current adjustment. The method generally includes sensing, with an amplifier, a first leakage current of a first capacitor in a filter for a PLL, or a second leakage current of a second capacitor representative of the first capacitor; controlling a current source with the amplifier based on the sensed first or second leakage current, such that a sourced current generated by the current source is approximately equal to the first leakage current; and injecting the sourced current into the first capacitor.

Certain aspects of the present disclosure provide a method for capacitor leakage current adjustment. The method generally includes sampling a first leakage current of a first capacitor in a filter for a PLL, or a second leakage current of a second capacitor representative of the first capacitor, wherein the sampling comprises closing a first set of switches for discontinuous sampling of the first or second leakage current; controlling a current source with an amplifier based on the sampled first or second leakage current, such that a sourced current generated by the current source is approximately equal to the first leakage current; and injecting the sourced current into the first capacitor.

Certain aspects of the present disclosure provide a method for capacitor leakage current adjustment. The method generally includes determining a leakage voltage based on a leakage current of a capacitor in a filter for a PLL, wherein the determining comprises closing a set of switches for discontinuous sampling of the leakage voltage; based on the sampled leakage voltage, generating a sourced current approximately equal to the leakage current; and injecting the sourced current into the capacitor.

Certain aspects of the present disclosure provide a circuit. The circuit generally includes a filter for a PLL comprising a first capacitor; an amplifier configured to sense a first leakage current of the first capacitor, or a second leakage current of a second capacitor representative of the first capacitor; and a current source configured to generate a sourced current for injection into the first capacitor, wherein the amplifier is configured to control the current source based on the sensed first or second leakage current such that the sourced current is approximately equal to the first leakage current.

Certain aspects of the present disclosure provide a circuit. The circuit generally includes a filter for a PLL comprising a first capacitor; a first set of switches configured to be closed for the circuit to sample a first leakage current of the first capacitor, or a second leakage current of a second capacitor representative of the first capacitor; a current source configured to generate a sourced current for injection into the first capacitor, and an amplifier configured to control the current source based on the sampled first or second leakage current such that the sourced current is approximately equal to the first leakage current.

Certain aspects of the present disclosure provide a circuit. The circuit generally includes a filter for a PLL comprising a capacitor; a set of switches configured to be closed for the circuit to sample a leakage voltage based on a leakage current of the capacitor; a current source configured to generate a sourced current for injection into the capacitor; and an amplifier configured to control the current source based on the sampled leakage voltage such that the sourced current is approximately equal to the leakage current.

According to certain aspects, the capacitor comprises a thin oxide capacitor.

According to certain aspects, the sourced current is injected into the capacitor such that a voltage drop across a resistor in series with the capacitor is approximately zero volts. In certain aspects, the circuit further includes a charge pump for the PLL. In this case, a first end of the capacitor may be coupled to a reference node for the filter, a second end of the capacitor may be coupled to a first end of the resistor and to the current source, and a second end of the resistor may be coupled to the charge pump.

According to certain aspects, the circuit further includes a sampling capacitor. In this case, the set of switches may be configured to be closed for the circuit to store the leakage voltage across the sampling capacitor and to short first and second inputs of the amplifier to a common-mode voltage of the filter. In certain aspects, the circuit further includes another set of switches. In this case, the current source may comprise a transistor, and the other set of switches may be configured to be closed for the circuit to sense the leakage voltage stored across the sampling capacitor with the first and second inputs of the amplifier and to connect an output of the amplifier with a gate of the transistor. In certain aspects, the circuit further includes a charge pump for the PLL. In this case, the set of switches may be closed if the charge pump is inactive. In certain aspects, the other set of switches is closed if the charge pump is active. In certain aspects, the circuit further includes another capacitor connected between a source and a gate of the transistor and configured to maintain a gate-to-source voltage of the transistor if the other set of switches is open. In certain aspects, the capacitor may be a thin oxide capacitor, and the sampling capacitor may be a thick oxide capacitor.

According to certain aspects, the circuit further includes another capacitor having a leakage current proportional to the leakage current of the capacitor in the filter, wherein the other capacitor is coupled to the a first input of the amplifier, a sampling capacitor coupled to a second input of the amplifier, and a voltage follower configured to buffer the leakage voltage. In this case, the set of switches may be configured to be closed for the circuit to store the buffered leakage voltage across the other capacitor and across the sampling capacitor. For certain aspects, the current source may comprise a first transistor, the other capacitor may be the same capacitor type as the capacitor in the filter, the first input of the amplifier may be coupled to the other capacitor and to a drain of a second transistor, an output of the amplifier may be coupled to a gate of the second transistor, and a capacitance ratio of the capacitor in the filter to the other capacitor may be equal to a size ratio of the first transistor to the second transistor. In certain aspects, the circuit further includes another set of switches configured, if closed, to connect the output of the amplifier with a gate of the first transistor. In certain aspects, the other set of switches is configured, if opened, to disconnect the output of the amplifier from the gate of the first transistor, and the set of switches is configured, if opened, to disconnect an output of the voltage follower from the other capacitor and from the sampling capacitor. In certain aspects, the circuit further includes a charge pump for the PLL. In this case, the set of switches may be closed if the charge pump is inactive, and the other set of switches may be closed if the charge pump is active. In certain aspects, the circuit further includes yet another capacitor connected between a source and a gate of the first transistor to maintain a gate-to-source voltage of the first transistor if the other set of switches is open. In certain aspects, the capacitor in the filter and the other capacitor may be thin oxide capacitors, and the sampling capacitor may be a thick oxide capacitor.

Certain aspects of the present disclosure provide an apparatus. The apparatus generally includes means for determining a leakage voltage based on a leakage current of a capacitor in a filter for a PLL, wherein the means for determining is configured to close a set of switches for discontinuous sampling of the leakage voltage; means for sourcing current; means for controlling the means for sourcing current based on the sampled leakage voltage, such that the sourced current is approximately equal to the leakage current; and means for injecting the sourced current into the capacitor.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and so on. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art.

An Example Wireless System

Figure 1:
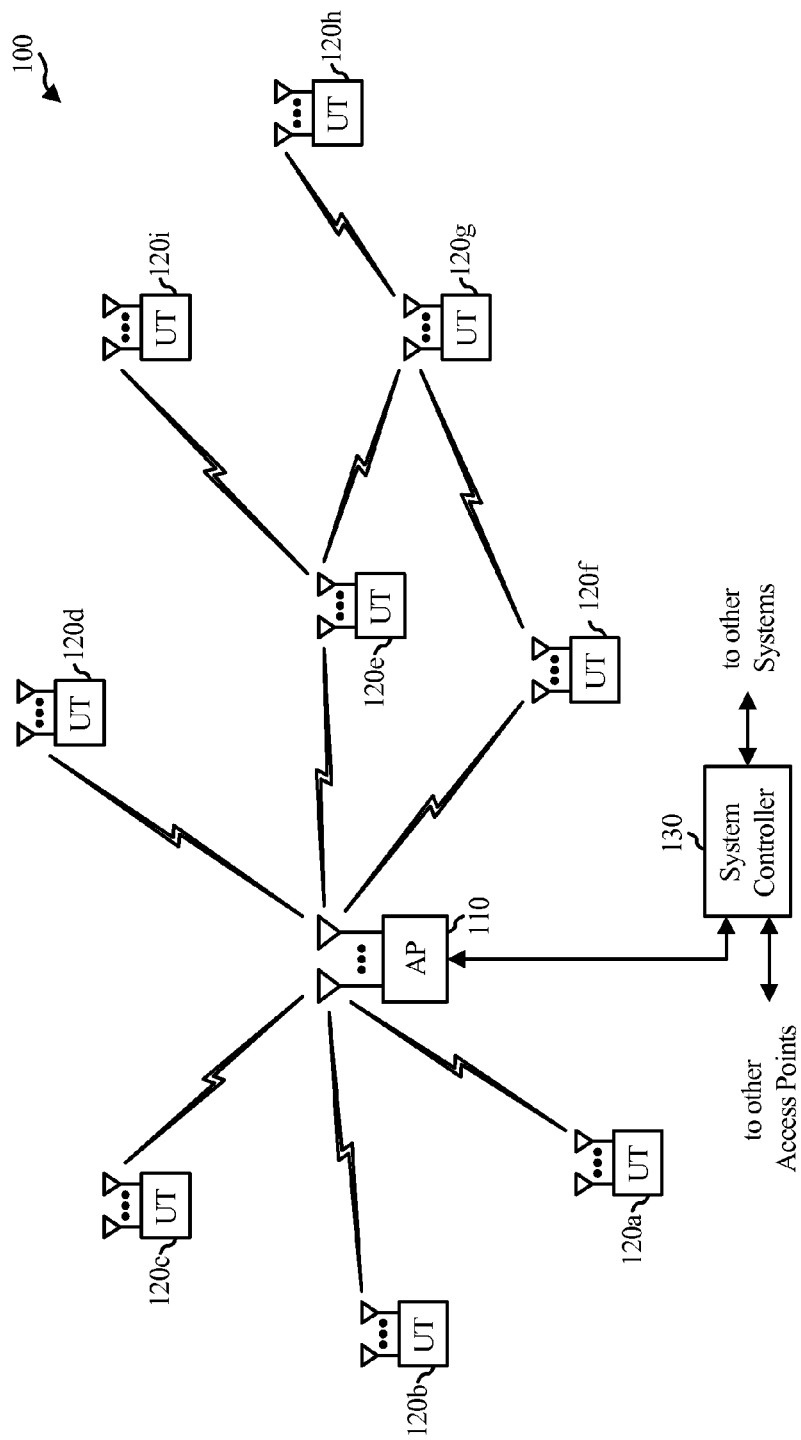
FIG. 1 is a diagram of an example wireless communications network in accordance with certain aspects of the present disclosure.

FIG. 1 illustrates a wireless communications system 100 with access points 110 and user terminals 120. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal 120 may be equipped with a single antenna (e.g., in order to keep costs down) or multiple antennas (e.g., where the additional cost can be supported).

Figure 2:
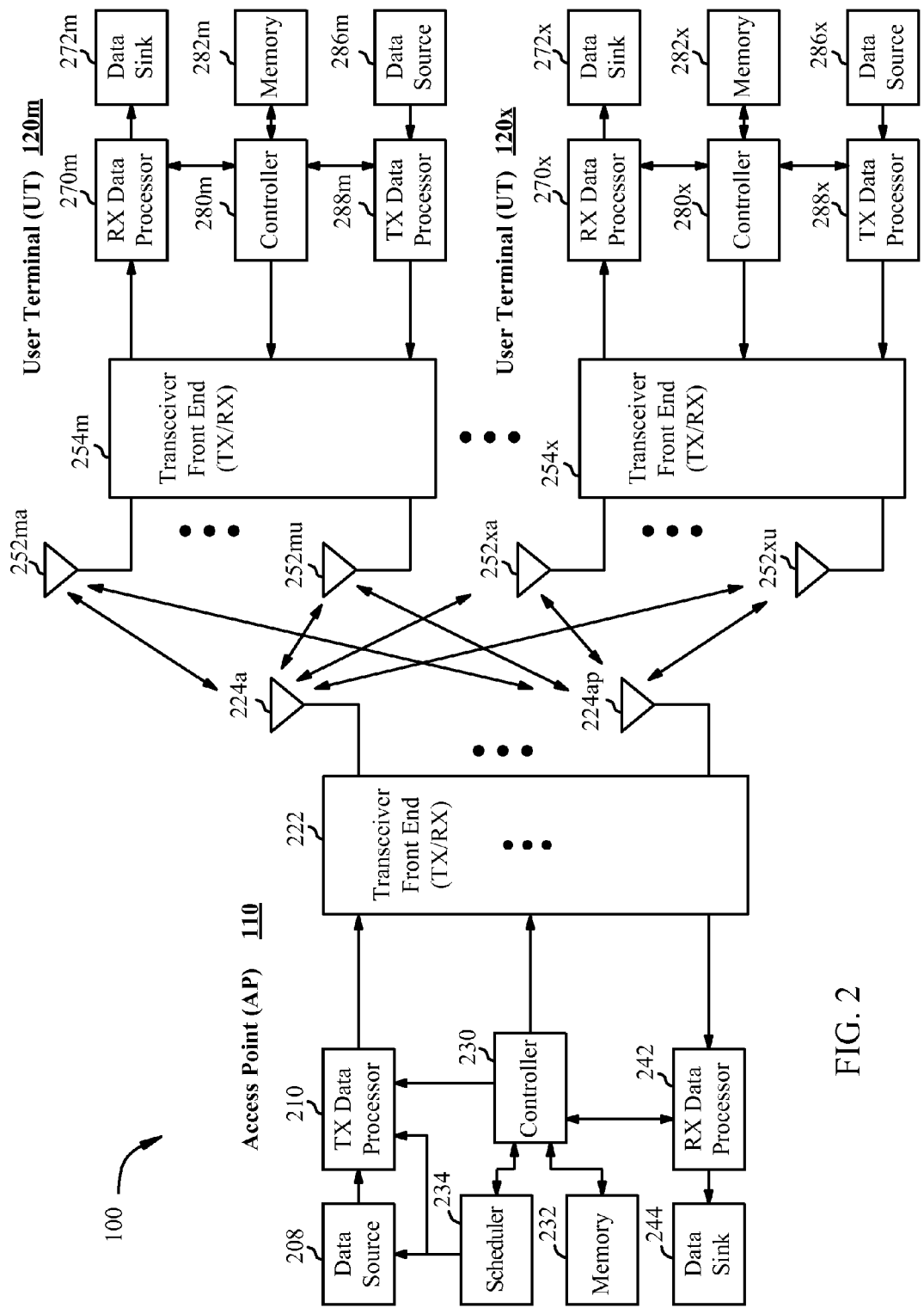
FIG. 2 is a block diagram of an example access point (AP) and example user terminals in accordance with certain aspects of the present disclosure.

FIG. 2 shows a block diagram of access point 110 and two user terminals 120m and 120x in wireless system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{ap}$ user terminals are selected for simultaneous transmission on the uplink, $N_{dn}$ user terminals are selected for simultaneous transmission on the downlink, $N_{ap}$ may or may not be equal to $N_{dn}$, and $N_{ap}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230

At each user terminal 120, $N_{ut,m}$ antennas 252 receive the downlink signals from access point 110. For receive diversity at the user terminal 120, the transceiver front end 254 may select signals received from one of the antennas 252 for processing. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
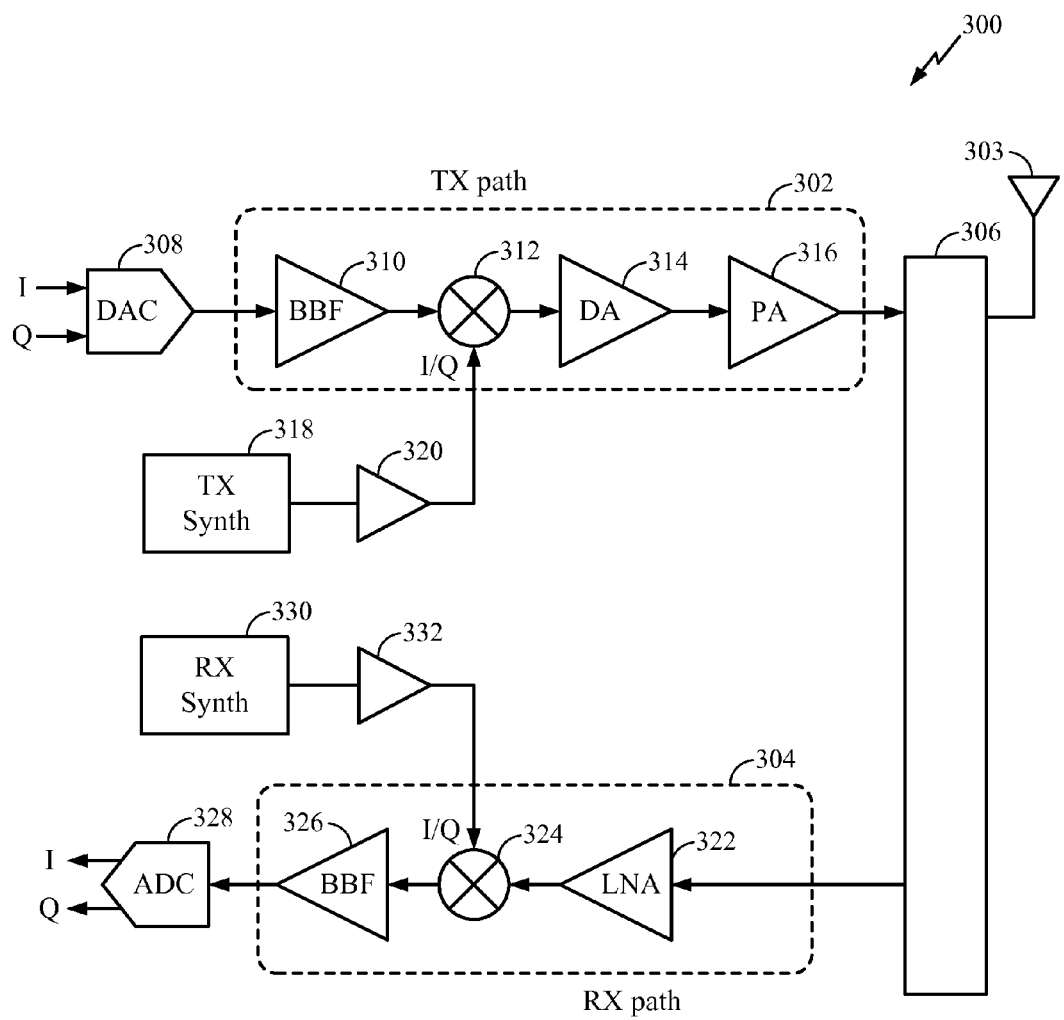
FIG. 3 is a block diagram of an example transceiver front end in accordance with certain aspects of the present disclosure.

FIG. 3 is a block diagram of an example transceiver front end 300, such as transceiver front ends 222, 254 in FIG. 2, in accordance with certain aspects of the present disclosure. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier 316. The BBF 310, the mixer 312, and the DA 314 may be included in a radio frequency integrated circuit (RFIC), while the PA 316 is often external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). Known as heterodyning, this frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) (e.g., in a phase-locked loop (PLL)) to generate a stable, tunable LO with a particular tuning range. Thus, the transmit LO is typically produced by a TX frequency synthesizer 318, which may be buffered or amplified by amplifier 320 before being mixed with the baseband signals in the mixer 312. Similarly, the receive LO is typically produced by an RX frequency synthesizer 330, which may be buffered or amplified by amplifier 332 before being mixed with the RF signals in the mixer 324.

Example Leakage Compensation Circuit

Thick oxide capacitors have been used in complementary metal-oxide-semiconductor (CMOS) design for filters, such as charge pump filters in phase-locked loop (PLL) circuits. However, thin layer metal oxide semiconductor (MOS) capacitors (a.k.a. thin oxide capacitors) may have greater density than thick oxide capacitors. For example, the density of thick oxide capacitors may be less than half that of thin oxide capacitors. The trend towards reducing chip area and saving more silicon (Si) has motivated replacing thick oxide capacitors with thin oxide capacitors.

Filters used in PLL circuits typically use bulky capacitors on the order of a few hundred picofarads, which take up a large amount of area in a PLL. However, the leakage current (or "leakage" for short) of thin oxide capacitors may be greater than that of thick oxide capacitors and, thus, may be problematic in many applications. For example, the leakage of thin oxide capacitors may be an issue for PLL filters. The leakage current of thin oxide capacitors may be more problematic in low power PLL designs (e.g., Bluetooth (BT) and frequency modulation (FM)) in which the capacitor leakage current is comparable with the PLL charge pump current. In addition, the leakage current of a thin oxide capacitor may be highly dependent on process, voltage, and temperature (PVT). For example, the voltage dependency of the leakage may cause severe nonlinearity in the PLL dynamic behavior.

Therefore, what is needed are apparatus and techniques for compensating for the leakage current of a thin oxide capacitor in PLL circuits. Aspects of the present disclosure provide feedback techniques that sense and compensate, or at least adjust, for this leakage current (e.g., by re-injecting current approximately equal to the leakage current back into the thin oxide capacitor). In certain aspects, the method of sensing the leakage current differentiates between filter capacitor leakage current and charge pump current.

Figure 4:
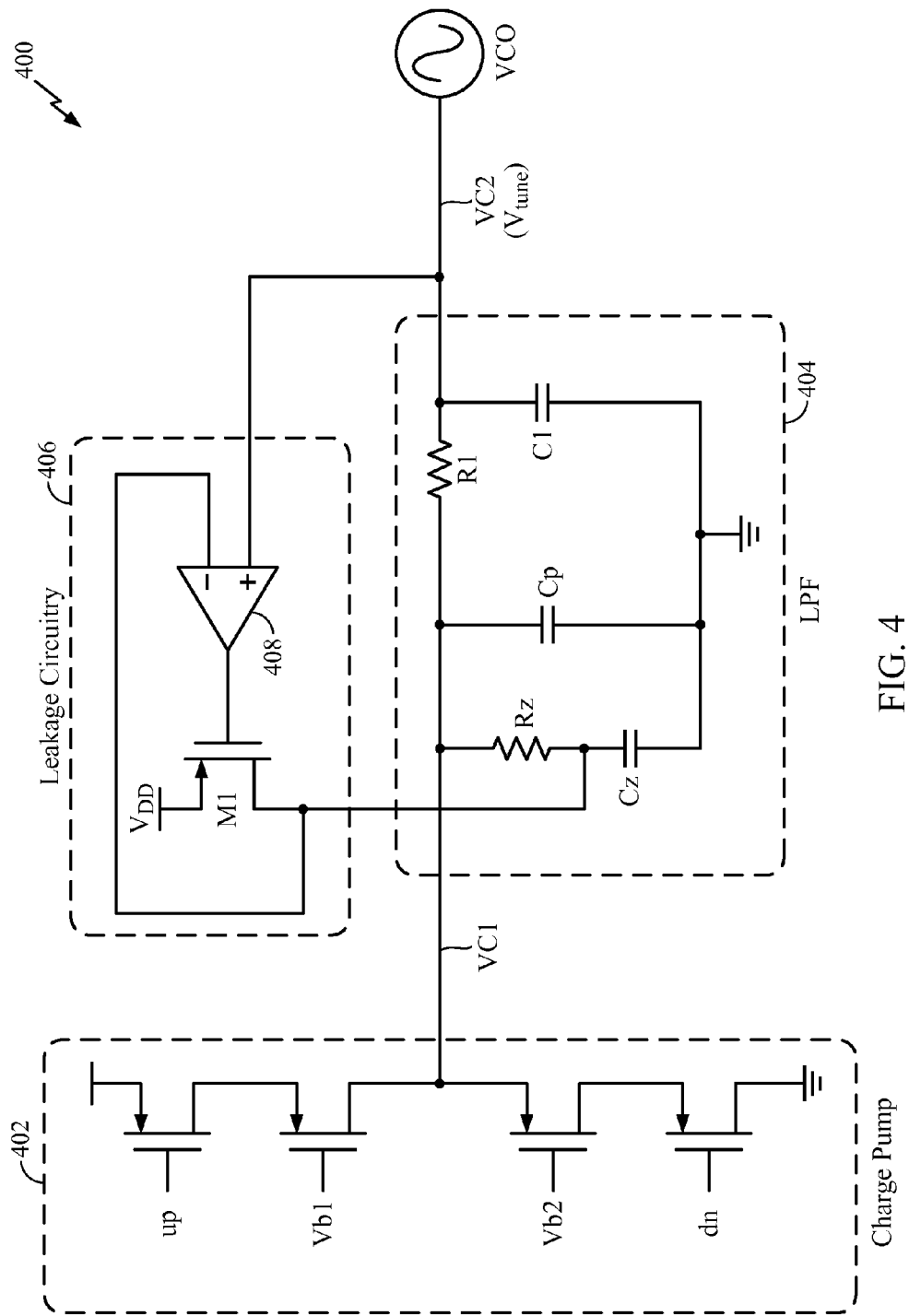
FIG. 4 is a circuit diagram of an example leakage compensation circuit operable during a phase-locked loop (PLL) lock condition, in accordance with certain aspects of the present disclosure.

FIG. 4 is a circuit diagram of an example circuit 400 for leakage current cancellation (e.g., compensation) during a PLL lock condition (i.e., when the PLL is locked in phase), in accordance with certain aspects of the present disclosure. The circuit 400 comprises a charge pump 402, a low pass filter (LPF) 404, and leakage circuitry 406. The leakage circuitry 406 may be configured to compensate for leakage current across a thin oxide capacitor $C_Z$ (e.g., the capacitor Cz may be a filter capacitor connected in series with a resistor Rz as shown).

An amplifier 408 of the leakage circuitry 406 senses a voltage representative of the leakage current across the capacitor Cz while the PLL is locked (e.g., the charge pump 402 is off). During the PLL lock duration, a voltage VC1 at an input of the LPF 404 may be equal to a voltage VC2 (e.g., tuning voltage (Vtune) for the VCO) at an output of the LPF 404 because the charge pump 402 may not be driving any (or very little) current across a resistor R1 in the LPF. Therefore, the differential input of the amplifier 408 effectively senses the voltage across the resistor Rz, which is representative of the leakage current of the capacitor Cz. That is, the leakage current across the capacitor Cz results in a differential voltage across the positive and negative terminals of the amplifier 408, which drives the gate of a PMOS transistor M1.

The transistor M1 compensates for the leakage current of the capacitor Cz by supplying (e.g., injecting) a current from power supply rail $V_{DD}$ to the capacitor Cz, based on the leakage current sensed by the amplifier 408. For example, the transistor M1 compensates for the leakage current of the capacitor Cz such that no voltage drop is sensed by the amplifier 408 across the resistor Rz (e.g., none of the leakage current of capacitor Cz is flowing across the resistor Rz).

Figure 5:
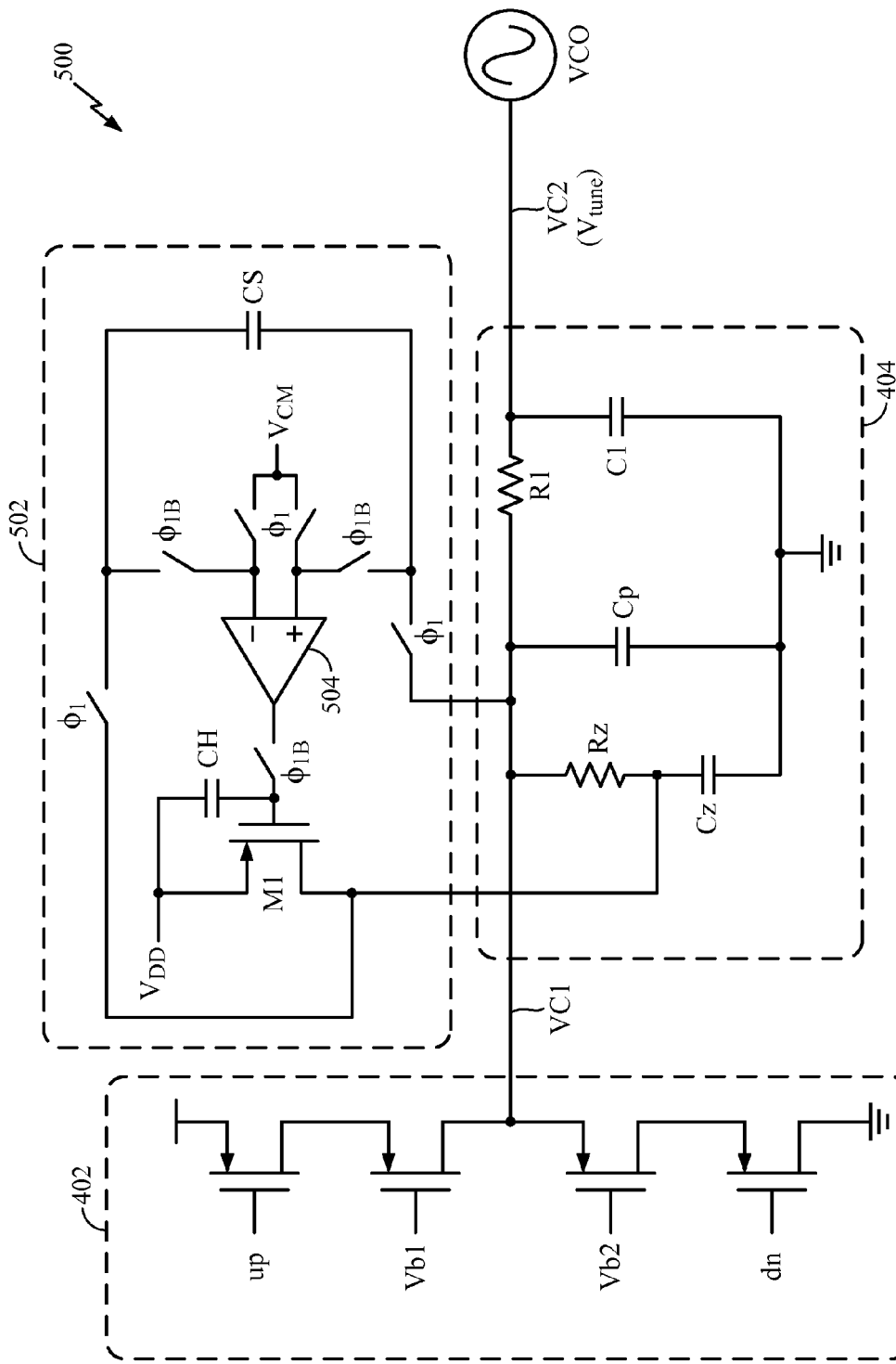
FIG. 5 is a circuit diagram of an example leakage compensation circuit comprising switches for sampling a leakage current during a sensing mode and injecting an equivalent leakage current during an action mode, in accordance with certain aspects of the present disclosure.

FIG. 5 is a circuit diagram of an example circuit 500 for leakage current compensation that may operate regardless of whether the PLL is locked (e.g., charge pump is active or inactive), in accordance with certain aspects of the present disclosure. The circuit 500 comprises the charge pump 402, the LPF 404, and leakage circuitry 502. The leakage circuitry 502 comprises a sampling capacitor Cs, which may be a thick oxide capacitor having a substantially lower leakage current than capacitor Cz. During a lock condition of the PLL (e.g., charge pump is off), switches $\phi_1$ are closed, and switches $\phi_{1B}$ are open (which may be referred to as the "sensing mode"). Therefore, the sampling capacitor Cs is connected in parallel to resistor Rz. Thus, the voltage across resistor Rz (e.g., due to the leakage current of capacitor Cz) will be stored on the sampling capacitor Cs during the sensing mode. This allows for the leakage current to be sensed independent of the charge transferred by the charge pump because the charge pump is off during the sensing mode.

When the PLL is not locked (e.g., charge pump is on), switches $\phi_1$ are opened, and switches $\phi_{1B}$ are closed (which may be referred to as the "action mode"). Thus, the sampling capacitor Cs is now connected to the positive and negative terminals of the amplifier 504. As a result, the voltage differential across the positive and negative terminals of the amplifier 504 is now equal to the voltage across the sampling capacitor Cs (based on the sensed leakage voltage during the PLL lock duration). Therefore, the amplifier 504 drives the gate voltage of transistor M1 based on this sampled leakage voltage, which is representative of the leakage current of capacitor Cz during the PLL lock duration. Thus, a current matching the leakage current across the capacitor Cz during the PLL lock duration is supplied to the capacitor Cz (e.g., from supply rail $V_{DD}$) when the PLL is not locked. In this manner, the leakage current is sensed and supplied independent of the charge transferred by the charge pump 402. In certain aspects, while the charge pump is off, the leakage voltage is stored on the sampling capacitor Cs at a rate that is lower than a reference frequency (Fref) of the PLL and higher than the PLL bandwidth (e.g., to ensure circuit stability).

During the sensing mode, the positive and negative terminals of the amplifier 504 are connected to a common-mode voltage ($V_{CM}$) (e.g., the switch $\phi_1$ connecting the terminals together is closed) such that the amplifier 504 stays in a linear mode. Therefore, when the PLL is no longer locked (e.g., switches $\phi_1$ are opened, and switches $\phi_{1B}$ are closed), the amplifier 504 can resume operations to control transistor M1 with reduced stabilization time. Moreover, during the sensing mode, the switch $\phi_{1B}$ between the output of the amplifier 504 and the gate of transistor M1 is open. However, capacitor $C_H$ coupled between the gate and source of transistor M1 maintains the gate-to-source voltage ($V_{GS}$) of transistor M1 such that the leakage compensation current supplied to the capacitor Cz continues even during the sensing mode (e.g., where the switches $\phi_{1B}$ are open).

Figure 6:
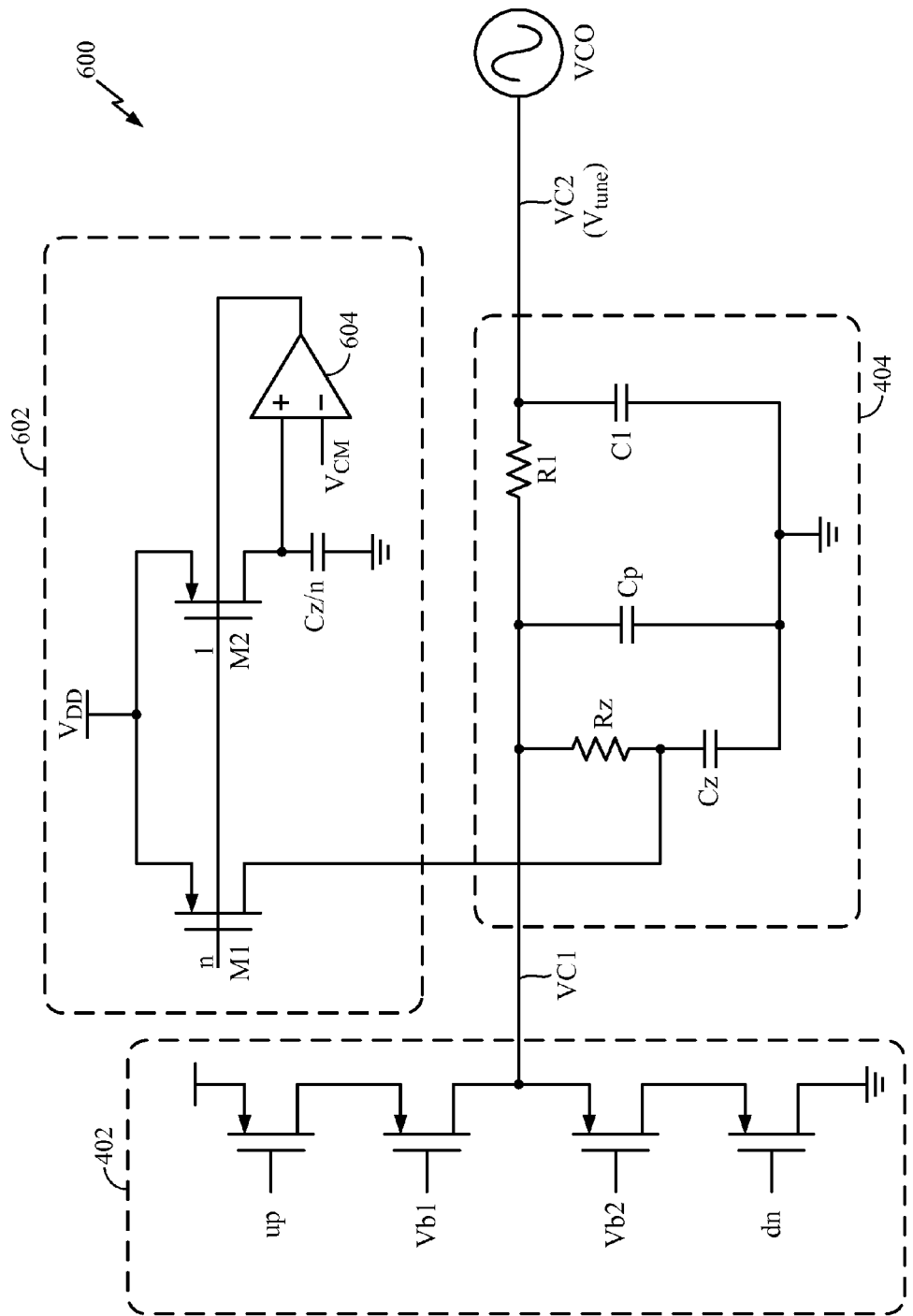
FIG. 6 is a circuit diagram of an example circuit for compensating for leakage of a filter capacitor using a representative capacitor having a leakage current that is proportional to the leakage of the filter capacitor, in accordance with certain aspects of the present disclosure.

FIG. 6 is a circuit diagram of an example circuit 600 for leakage current compensation using a capacitor having a leakage current that is representative of the leakage current of filter capacitor Cz, in accordance with certain aspects of the present disclosure. For example, the leakage circuitry 602 comprises a thin oxide capacitor Cz/n, which has a leakage current that is n times smaller than the leakage current of the capacitor Cz. The capacitor Cz/n is coupled with a drain of PMOS transistor M2, which has a size n times smaller than the transistor M1 (e.g., in certain aspects, n=10). An amplifier 604, the output of which controls the gates of both transistors M1 and M2, may sense the leakage current across the capacitor Cz/n, which is proportional to the leakage across the filter capacitor Cz (e.g., by the ratio of 1/n). Therefore, the amplifier 604 drives the transistor M2 to compensate, or at least adjust, for leakage across the capacitor Cz/n and drives the transistor M1 with the same voltage, which should compensate, or at least adjust, for the leakage in the capacitor Cz. That is, the current supplied to Cz may be n times greater than the leakage current of Cz/n (e.g., due to the size ratio (n:1) of transistor M1 to transistor M2). The positive terminal of the amplifier 604 may be coupled to one end of the capacitor Cz/n, whereas the negative terminal of the amplifier 604 may be coupled to a common-mode voltage ($V_{CM}$) for the filter 404.

Figure 7:
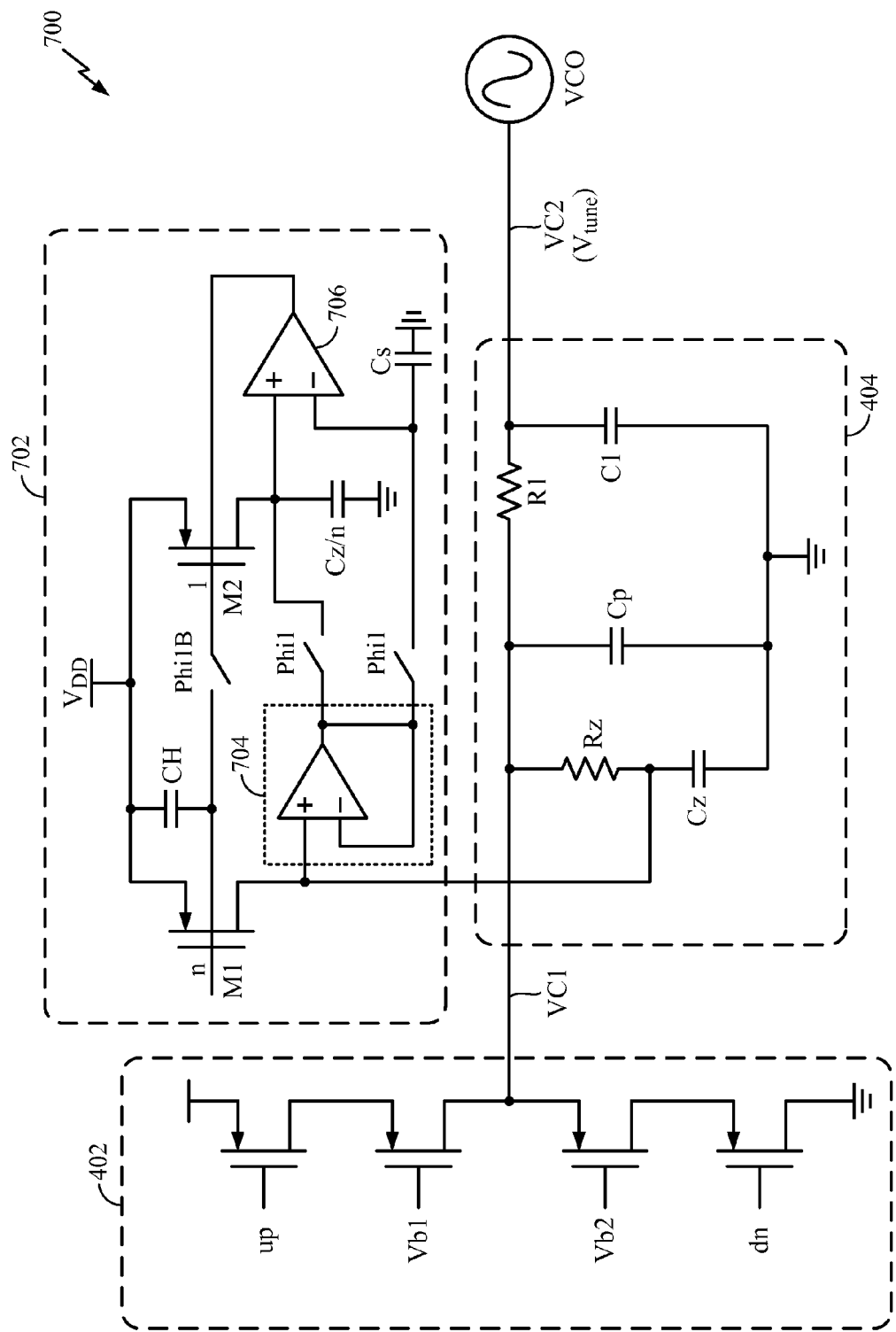
FIG. 7 is a circuit diagram of an example circuit for compensating for leakage of a filter capacitor using a sampling capacitor, a buffer, and a representative capacitor having a leakage current that is proportional to the leakage of the filter capacitor, in accordance with certain aspects of the present disclosure.

FIG. 7 is a circuit diagram of an example circuit 700 for leakage current compensation using a representative capacitor Cz and a sampling capacitor Cs, in accordance with certain aspects of the present disclosure. The leakage circuitry 702 includes a buffer 704 coupled to switches Phi1. The buffer 704 is utilized in an effort to isolate the leakage sampling circuit from the filter capacitor Cz. During a sensing mode, switches Phi1 are closed, switch Phi1B is open, and the buffer 704 charges capacitors Cz/n and Cs to a voltage approximately equal to the voltage across the capacitor Cz. In certain aspects, the capacitor Cz/n is a thin oxide capacitor (e.g., having leakage proportional to leakage of the capacitor Cz by the capacitance ratio n), and the sampling capacitor Cs is a thick oxide capacitor (e.g., having lower leakage current than the thin oxide capacitor Cz). For example, the sampling capacitor Cs may have a capacitance of 250 fF. In addition, during the sensing mode, switch Phi1B is open, and capacitor $C_H$ maintains the $V_{GS}$ of transistor M1. Therefore, the injection current from transistor M1 will continue during the sensing mode.

During the action mode, switches Phi1 are opened, and switch Phi1B is closed. Thus, buffer 704 is decoupled from and no longer charges capacitors Cz/n and Cs. As a result, the voltage across the capacitor Cz/n will drop at a faster rate than the voltage across the capacitor Cs, due to the higher leakage of Cz/n (because capacitor Cz/n is a thin oxide capacitor and Cs is a thick oxide capacitor). Therefore, the voltage difference between capacitors Cz/n and Cs, caused in large part by the leakage of capacitor Cz/n, is representative of the leakage of capacitor Cz, which is also a thin oxide capacitor.

Thus, during the action mode, amplifier 706 drives the transistors M1 and M2 based on a difference between the voltages across the capacitors Cz/n and Cs, which is representative of the leakage of capacitor Cz/n. The leakage of capacitor Cz/n will be proportional, by a ratio of 1/n, to the leakage of capacitor Cz. Therefore, by driving the transistor M1 (e.g., having an area that is n times greater than that of the transistor M2), the leakage current across capacitor Cz may be compensated. In certain aspects, the update rate (e.g., rate at which the voltage of capacitor Cz is sampled) may be greater than the PLL bandwidth and less than the reference frequency of the PLL.

In certain aspects, the amplifier 706 may be an operational transconductance amplifier (OTA) having a PMOS input and an operating range greater than 1 V (e.g., 1.8 V). The leakage compensation loop may be stable without the addition of any compensation capacitors. Using a thin oxide capacitor in the filter according to aspects of the present disclosure may save 40% area for PLL circuitry as compared to using thick oxide capacitors. Moreover, aspects of the present disclosure may reduce leaker current (e.g., better charge pump phase noise, thereby lowering the spur). In certain aspects, noise may be filtered by the relatively large Cz capacitor.

In certain aspects, a compensation circuit may be provided that samples the voltage of the capacitor Cz if the Vtune (VC2) of the VCO reaches a certain threshold. That is, the voltage of the capacitor Cz may not be sampled when the PLL is locked (e.g., charge pump is off) because the voltage of the capacitor Cz may not change significantly in this condition.

In certain aspects, the leakage current of the capacitor Cz may be sampled when Vtune (i.e., VC2) changes sufficiently (e.g., corresponding to a change in voltage across capacitor Cz). For example, comparators may be used to compare Vtune or the capacitor Cz voltage with a number of thresholds (e.g., 16 thresholds may be used). The greater the number of thresholds, the greater resolution there may be in determining a change in the capacitor Cz voltage or Vtune. The leakage circuitry 702 may sample the capacitor Cz voltage based on a determination that this voltage has changed sufficiently (e.g., based on the comparison of the capacitor Cz voltage with the threshold voltages). By sampling the capacitor Cz voltage after this voltage changes sufficiently, the sampling circuitry can be off during a portion of the time when the PLL is working to enter a locked condition. However, this introduces a tradeoff between accuracy and the number of times the leakage current is sampled. While most of the leakage current of the capacitor Cz may be compensated by the leakage circuitry, a remaining portion may be compensated by a leaker used for the charge pump linearity, for example.

Figure 8:
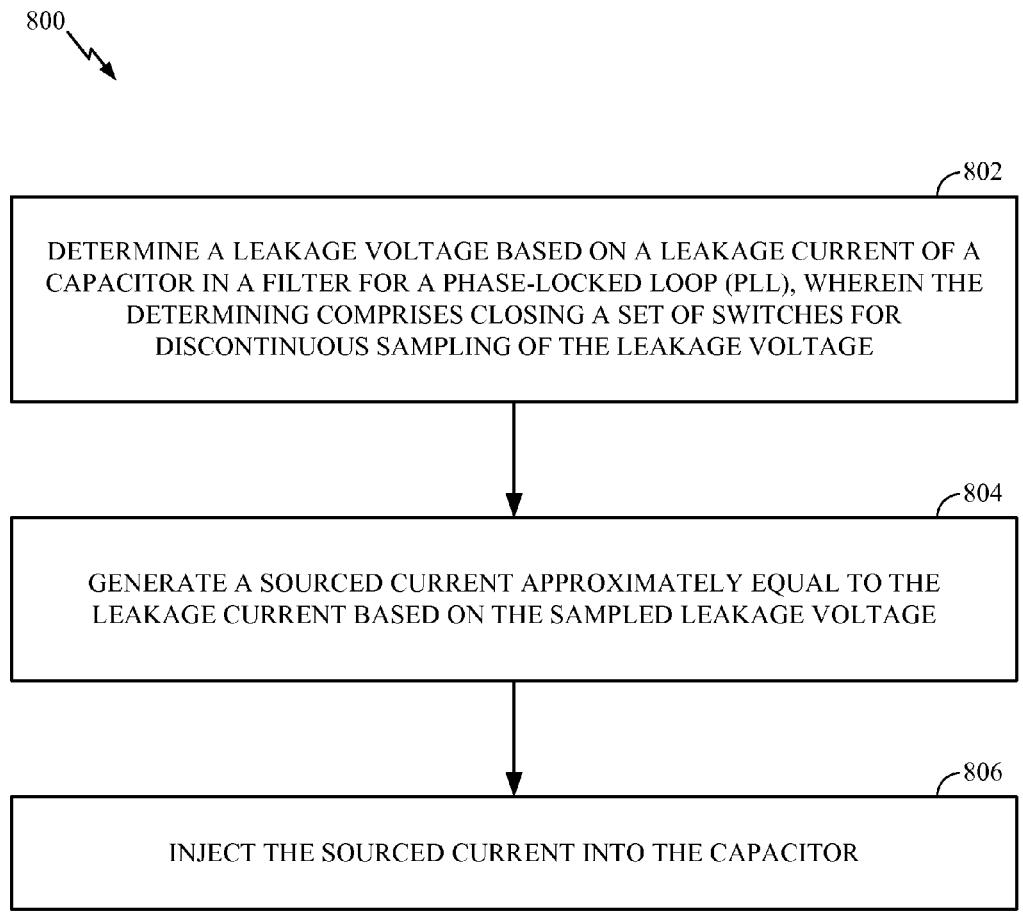
FIG. 8 is a flow diagram of example operations for compensating, or at least adjusting, for capacitor leakage, in accordance with certain aspects of the present disclosure.

FIG. 8 is a flow diagram of example operations 800 for leakage current compensation, or at least adjustment, in accordance with certain aspects of the present disclosure.

The operations 800 may be performed, for example, by a circuit, such as the circuits 500, 700 for leakage current compensation illustrated in FIGS. 5 and 7.

The operations 800 may begin, at block 802, with the circuit determining a leakage voltage based on a leakage current of a capacitor (e.g., Cz) in a filter for a phase-locked loop (PLL). The capacitor may be a thin oxide capacitor, for example. The determining at block 802 may involve closing a set of switches (e.g., switches $\phi_1$ or Phi1) for discontinuous sampling of the leakage voltage. At block 804, the circuit may generate a sourced current approximately equal to the leakage current, based on the sampled leakage voltage. At block 806, an element of the circuit may inject the sourced current into the capacitor.

According to certain aspects, the injecting at block 806 involves injecting the sourced current into the capacitor such that a voltage drop across a resistor (e.g., Rz) in series with the capacitor is approximately zero volts (0 V). A first end of the capacitor may be coupled to a reference node (e.g., electrical ground) for the filter, and a second end of the capacitor may be coupled to a first end of the resistor and to a current source configured to generate the sourced current. A second end of the resistor may be coupled to a charge pump (e.g., charge pump 402) of the PLL.

According to certain aspects, the sampled leakage voltage is equal to a voltage potential generated by the leakage current of the capacitor passing through the resistor in series with the capacitor, as in FIG. 5. For other aspects, the sampled leakage voltage is equal to a voltage potential generated by the leakage current of the capacitor passing through a series equivalent resistance ($R_{eq}$) of the capacitor, as in FIG. 7.

According to certain aspects, generating the sourced current at block 804 entails controlling a current source with an amplifier (e.g., amplifier 504 or 706) based on the sampled leakage voltage. For certain aspects, the current source comprises a transistor (e.g., M1). In this case, an output of the amplifier may be coupled to a gate of the transistor, a source of the transistor may be coupled to a power supply rail, and a drain of the transistor may be coupled to the capacitor.

According to certain aspects, the determining at block 802 involves closing the set of switches to store the leakage voltage across a sampling capacitor (e.g., Cs) and to short first and second inputs of the amplifier to a common-mode voltage ($V_{CM}$) of the filter. In certain aspects, the current source comprises a transistor (e.g., M1). In this case, the controlling at block 804 may entail closing another set of switches (e.g., switches $\phi_{1B}$) to sense the leakage voltage stored across the sampling capacitor with the first and second inputs of the amplifier and to connect an output of the amplifier with a gate of the transistor. In certain aspects, the set of switches is closed if a charge pump (e.g., charge pump 402) of the PLL is inactive, and the other set of switches is closed if the charge pump of the PLL is active. In certain aspects, another capacitor (e.g., $C_H$) is connected between a source and a gate of the transistor and is configured to maintain a gate-to-source voltage ($V_{GS}$) of the transistor if the other set of switches is open. In certain aspects, the capacitor may be a thin oxide capacitor, and the sampling capacitor may be a thick oxide capacitor.

According to certain aspects, the determining at block 802 may include buffering the leakage voltage with a voltage follower (e.g., buffer 704) and closing the set of switches to store the buffered leakage voltage across a sampling capacitor (e.g., Cs) and across another capacitor (e.g., Cz/n) having a leakage current proportional to the leakage current of the capacitor in the filter. For certain aspects, the current source comprises a first transistor (e.g., M1). The other capacitor may be the same capacitor type as the capacitor in the filter. A first input of the amplifier may be coupled to the other capacitor and to a drain of a second transistor, and a second input of the amplifier may be coupled to the sampling capacitor. In this case, an output of the amplifier may be coupled to a gate of the second transistor. A capacitance ratio (n) of the capacitor to the other capacitor may be equal to a size ratio of the first transistor to the second transistor.

In certain aspects, the controlling at block 804 includes closing another set of switches (e.g., switches Phi1B) to connect the output of the amplifier with a gate of the first transistor and driving the gate of the first transistor and the gate of the second transistor with the amplifier. In certain aspects, the determining at block 802 further involves opening the other set of switches to disconnect the output of the amplifier from the gate of the first transistor. In this case, the controlling at block 804 may further entail opening the set of switches to disconnect an output of the voltage follower from the other capacitor and from the sampling capacitor. In certain aspects, the set of switches is closed if a charge pump of the PLL is inactive, and the other set of switches is closed if the charge pump is active. In certain aspects, yet another capacitor (e.g., $C_H$) is connected between a source and a gate of the first transistor to maintain a gate-to-source voltage of the first transistor if the other set of switches is open. In certain aspects, the capacitor in the filter and the other capacitor may be thin oxide capacitors, and the sampling capacitor may be a thick oxide capacitor.

According to certain aspects, the determining at block 802 may involve opening another set of switches (e.g., switches $\phi_1$ or Phi1B) for the discontinuous sampling of the leakage voltage.

The various operations or methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for receiving may comprise a receiver (e.g., the transceiver front end 254 of the user terminal 120 depicted in FIG. 2 or the transceiver front end 222 of the access point 110 shown in FIG. 2) and/or an antenna (e.g., the antennas 252ma through 252mu of the user terminal 120m portrayed in FIG. 2 or the antennas 224a through 224ap of the access point 110 illustrated in FIG. 2). Means for processing or means for determining may comprise a processing system, which may include one or more processors, such as the RX data processor 270, the TX data processor 288, and/or the controller 280 of the user terminal 120 illustrated in FIG. 2.

Means for determining a leakage voltage and means for controlling may comprise an amplifier, such as the amplifiers 408, 504, 604, and 706 of FIGS. 4-7. Additionally or alternatively, means for determining the leakage voltage may comprise a sampling capacitor, such as sampling capacitor Cs shown in FIGS. 5 and 7, and/or one or more sets of switches (e.g., switches $\phi_1$ and/or $\phi_m$ depicted in FIG. 5 or switches Phi1 and/or Phi1B depicted in FIG. 7). Means for sourcing current and means for injecting current may comprise a current source (e.g., a transistor, such as transistor M1 illustrated in FIGS. 4-7). Additionally or alternatively, means for injecting current may comprise a wire or trace connected to (or close to) a terminal of a capacitor, such as filter capacitor Cz, as portrayed in FIGS. 5 and 7.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method comprising:
   determining a leakage voltage based on a leakage current of a capacitor in a filter for a phase-locked loop (PLL), wherein the determining comprises closing a set of switches for discontinuous sampling of the leakage voltage;
   based on the determined leakage voltage, generating a sourced current approximately equal to the leakage current; and
   injecting the sourced current into the capacitor.

2. The method of claim 1, wherein the capacitor comprises a thin oxide capacitor.

3. The method of claim 1, wherein the injecting comprises injecting the sourced current into the capacitor such that a voltage drop across a resistor in series with the capacitor is approximately zero volts.

4. The method of claim 3, wherein the determined leakage voltage is equal to a voltage potential generated by the leakage current of the capacitor passing through the resistor in series with the capacitor.

5. The method of claim 1, wherein generating the sourced current comprises controlling a current source with an amplifier based on the determined leakage voltage.

6. The method of claim 5, wherein the determining comprises closing the set of switches to:
   store the leakage voltage across a sampling capacitor; and
   short first and second inputs of the amplifier to a common-mode voltage of the filter.

7. The method of claim 6, wherein the current source comprises a transistor and wherein the controlling comprises closing another set of switches to:
   sense the leakage voltage stored across the sampling capacitor with the first and second inputs of the amplifier; and
   connect an output of the amplifier with a gate of the transistor.

8. The method of claim 7, wherein the set of switches is closed if a charge pump of the PLL is inactive and wherein the other set of switches is closed if the charge pump of the PLL is active.

9. The method of claim 7, wherein another capacitor is connected between a source and a gate of the transistor and is configured to maintain a gate-to-source voltage of the transistor if the other set of switches is open.

10. The method of claim 6, wherein the capacitor comprises a thin oxide capacitor and wherein the sampling capacitor comprises a thick oxide capacitor.

11. The method of claim 5, wherein the determining comprises:
    buffering the leakage voltage with a voltage follower; and
    closing the set of switches to store the buffered leakage voltage across a sampling capacitor and across another capacitor having a leakage current proportional to the leakage current of the capacitor in the filter.

12. The method of claim 11, wherein:
    the current source comprises a first transistor;
    the other capacitor is the same capacitor type as the capacitor in the filter;
    a first input of the amplifier is coupled to the other capacitor and to a drain of a second transistor;
    a second input of the amplifier is coupled to the sampling capacitor;
    an output of the amplifier is coupled to a gate of the second transistor; and
    a capacitance ratio of the capacitor to the other capacitor is equal to a size ratio of the first transistor to the second transistor.

13. The method of claim 12, wherein the controlling comprises:
    closing another set of switches to connect the output of the amplifier with a gate of the first transistor; and
    driving the gate of the first transistor and the gate of the second transistor with the amplifier.

14. The method of claim 13, wherein the determining further comprises opening the other set of switches to disconnect the output of the amplifier from the gate of the first transistor and wherein the controlling further comprises opening the set of switches to disconnect an output of the voltage follower from the other capacitor and from the sampling capacitor.

15. The method of claim 13, wherein the set of switches is closed if a charge pump of the PLL is inactive and wherein the other set of switches is closed if the charge pump is active.

16. The method of claim 11, wherein the capacitor and the other capacitor comprise thin oxide capacitors and wherein the sampling capacitor comprises a thick oxide capacitor.

17. A circuit comprising:
    a filter for a phase-locked loop (PLL) comprising a capacitor;
    a set of switches configured to be closed for the circuit to sample a leakage voltage based on a leakage current of the capacitor;
    a current source configured to generate a sourced current for injection into the capacitor; and
    an amplifier configured to control the current source based on the sampled leakage voltage such that the sourced current is approximately equal to the leakage current.

18. The circuit of claim 17, wherein the sourced current is injected into the capacitor such that a voltage drop across a resistor in series with the capacitor is approximately zero volts.

19. The circuit of claim 18, further comprising a charge pump for the PLL, wherein:
a first end of the capacitor is coupled to a reference node for the filter;
a second end of the capacitor is coupled to a first end of the resistor and to the current source; and
a second end of the resistor is coupled to the charge pump.

20. The circuit of claim 17, further comprising a sampling capacitor, wherein the set of switches is configured to be closed for the circuit to:
store the leakage voltage across the sampling capacitor; and
short first and second inputs of the amplifier to a common-mode voltage of the filter.

21. The circuit of claim 20, further comprising another set of switches, wherein the current source comprises a transistor and wherein the other set of switches is configured to be closed for the circuit to:
sense the leakage voltage stored across the sampling capacitor with the first and second inputs of the amplifier; and
connect an output of the amplifier with a gate of the transistor.

22. The circuit of claim 21, further comprising a charge pump for the PLL, wherein the set of switches is closed if the charge pump is inactive and wherein the other set of switches is closed if the charge pump is active.

23. The circuit of claim 21, further comprising another capacitor connected between a source and a gate of the transistor and configured to maintain a gate-to-source voltage of the transistor if the other set of switches is open.

24. The circuit of claim 20, wherein the capacitor comprises a thin oxide capacitor and wherein the sampling capacitor comprises a thick oxide capacitor.

25. The circuit of claim 17, further comprising:
another capacitor having a leakage current proportional to the leakage current of the capacitor in the filter, wherein the other capacitor is coupled to a first input of the amplifier;
a sampling capacitor coupled to a second input of the amplifier; and
a voltage follower configured to buffer the leakage voltage, wherein the set of switches is configured to be closed for the circuit to store the buffered leakage voltage across the other capacitor and across the sampling capacitor.

26. The circuit of claim 25, wherein:
the current source comprises a first transistor;
the other capacitor is the same capacitor type as the capacitor in the filter;
the first input of the amplifier is coupled to the other capacitor and to a drain of a second transistor;
an output of the amplifier is coupled to a gate of the second transistor; and
a capacitance ratio of the capacitor in the filter to the other capacitor is equal to a size ratio of the first transistor to the second transistor.

27. The circuit of claim 26, further comprising another set of switches configured, if closed, to connect the output of the amplifier with a gate of the first transistor.

28. The circuit of claim 27, wherein the other set of switches is configured, if opened, to disconnect the output of the amplifier from the gate of the first transistor and wherein the set of switches is configured, if opened, to disconnect an output of the voltage follower from the other capacitor and from the sampling capacitor.

29. The circuit of claim 27, further comprising a charge pump for the PLL, wherein the set of switches is closed if the charge pump is inactive and wherein the other set of switches is closed if the charge pump is active.

30. The circuit of claim 25, wherein the capacitor in the filter and the other capacitor comprise thin oxide capacitors and wherein the sampling capacitor comprises a thick oxide capacitor.

* * * * *